United States Patent
Smargiassi et al.

(10) Patent No.: US 6,515,261 B1
(45) Date of Patent: Feb. 4, 2003

(54) ENHANCED LIFT PIN

(75) Inventors: Eugene Smargiassi, San Jose, CA (US); Aaron Hunter, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/093,275

(22) Filed: Mar. 6, 2002

(51) Int. Cl.[7] .................................................. F27B 5/14
(52) U.S. Cl. ........................ 219/390; 219/405; 219/411; 118/724; 118/50.1; 392/416
(58) Field of Search .................................. 219/390, 405, 219/411; 118/724, 725, 50.1; 392/416, 418

(56) References Cited

U.S. PATENT DOCUMENTS

| | | | |
|---|---|---|---|
| 5,315,092 A | * 5/1994 | Takahashi et al. | .......... 219/497 |
| 5,651,823 A | 7/1997 | Parodi et al. | ............... 118/500 |
| 6,149,728 A | 11/2000 | Park et al. | .................. 118/712 |
| 6,151,446 A | 11/2000 | Hunter et al. | ............... 392/416 |
| 6,171,402 B1 | * 1/2001 | Strodtbeck et al. | ......... 118/712 |
| 6,311,016 B1 | * 10/2001 | Yanagawa et al. | .......... 392/416 |
| 6,313,443 B1 | 11/2001 | Harnik et al. | ............... 219/405 |
| 6,342,691 B1 | 1/2002 | Johnsgard et al. | .......... 219/390 |

* cited by examiner

Primary Examiner—Teresa Walberg
Assistant Examiner—Shawntina T. Fuqua
(74) Attorney, Agent, or Firm—Pennie & Edmonds LLP

(57) ABSTRACT

An apparatus and method for thermally processing a substrate employs lift pin for supporting or contacting the substrate while conveying radiation from the substrate to a detector and/or processor through a hollow member. The lift pin comprises a contact member flexibly mounted on the hollow member to adjust to the angle of the substrate. By conforming the orientation of the contact member to the angle of the substrate, accurate detection and processing of the substrate may be performed.

19 Claims, 2 Drawing Sheets

ENHANCED LIFT PIN

BACKGROUND OF THE INVENTION

This invention relates to apparatus and methods of thermally processing a material such as a semiconductor substrate, and, in particular, to apparatus and methods for processing of a semiconductor substrate requiring precise measurement and control of the temperature over a wide range of temperatures. One example of such processing is rapid thermal processing (RTP), which is used for a number of fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). In the particular application of CMOS gate dialectric formation by RTO or RTN, thickness, growth temperature, and uniformity of the gate dialectrics are critical parameters that influence the overall device performance and fabrication yield. At least some of these processes require that temperature across the substrate vary by less than a few degrees Celsius.

During thermal processing, precise measurement of the substrate temperature may be required at various stages of the processing, including such stages as heating or preheating of the substrate. During the preheating stage, the substrate is typically held on one or more lift pins while it is heated by one or more radiative heat sources. During this heating process, the temperature of the substrate must be accurately determined. This determination may be provided to a feedback controller to adjust the power of the radiative heat source(s), thereby optimizing the heating process.

Measurement of the substrate temperature is conducted by various means. At temperatures above approximately 300–325EC, pyrometers may be employed to measure the substrate temperature based on the radiation which is emitted by the substrate. At lower temperatures, the emission intensity from the substrate (within the wavelength range to which pyrometers are most sensitive) generally is insufficient for the pyrometers to accurately measure substrate temperature. Contact probes (e.g., thermocouples) are therefore used to monitor substrate temperature, at lower temperatures. Such direct temperature measurement techniques, however, are difficult to reliably implement because of various problems, including degradation of the contact probe and maintenance of a stable thermal contact between the probe and the substrate.

One particular method of measuring the substrate temperature, including measurements below temperatures of approximately 300–325EC, which typically occur during preheating, involves measuring the temperature through the lift pins which support the substrate during heating. These lift pins typically comprise a hollow body through which radiation is transmitted. One end of the hollow body is in contact with the substrate, while the other end is connected to a detection and/or processing system. Radiation emitted from the substrate passes through the hollow body, and is conveyed to the detection system. The intensity of the radiation at certain wavelengths is then measured, and the temperature is derived from that intensity. U.S. Pat. No. 6,151,446, which is incorporated herein by reference, describes such a method.

Such systems, however, still suffer from a lack of accuracy. The determination of the substrate temperature is highly dependent on the intensity of the radiation received by the detector. If the radiation received by the detector does not accurately represent the light emitted by the substrate, the determination of the substrate temperature will likewise be inaccurate. That situation can arise, for instance, if the lift pins do not fully or closely seat against the substrate. Gaps between the ends of the lift pins and the surface of the substrate can allow radiation emitted by the substrate to escape, or can allow other radiation, which was not emitted by the substrate, to enter the lift pin. Either case may result in inaccurate measurement of the substrate temperature.

A need therefore exists for a more accurate method and apparatus for measuring substrate temperature.

SUMMARY

This invention is generally directed to method and apparatus for processing radiation emitted by a substrate. A lift pin is configured to convey radiation from the substrate to a measuring or processing device such as a pyrometer. One end of the lift pin comprises a contact surface configured to contact the substrate. The contact surface is flexibly connected so that the position and/or orientation of the contact surface may be adjusted to accommodate the surface of the substrate.

As used herein, the term substrate broadly refers to any object that is being processed in a thermal process chamber. Such substrates may include, for example, semiconductor wafers, flat panel displays, glass plates or disks, and plastic workpieces.

In one embodiment, the lift pin comprises a hollow member configured to convey radiation to a pyrometer or other receiving device. The lift pin further comprises a contact member flexibly connected to the hollow member. This connection may be a pivotal or rotatable connection, or may comprise any method of flexible connection known in the art. In one embodiment, the hollow member and the contact member are connected by a ball and socket joint. This flexible connection allows the contact member to seat against the adjoining portion of the substrate surface, improving the conveyance of radiation from the substrate to the pyrometer. One advantage of a ball and socket type connection is that such a connection can accommodate a central channel for transmitting radiation. Of course, the invention is not limited to lift pins that support the substrate; other types of pins or probes may be employed within the scope of the present invention.

Preferably, the invention is employed in a system for measuring substrate temperatures during thermal processing. As a substrate is radiatively heated, a contact member is in contact with the surface of the substrate. The contact member is flexibly mounted, allowing it to seat closely or snugly against the surface of the substrate. The contact member is connected to a hollow member. Radiation emitted from the substrate is conveyed past the contact member, through the hollow member, and to the pyrometer or other receiving device. The contact member and the hollow member are configured to provide the most efficient and accurate transmittal of radiation to the pyrometer. Further, gaps between the contact member and the substrate are reduced or eliminated by the flexible connection between the contact member and the hollow member, allowing the contact member to adjust to the angle of the substrate surface. In this way, radiation received by the pyrometer is conveyed directly from the substrate; losses or leakage outside of the lift pin are minimized or eliminated.

For a better understanding of these and other aspects of the present invention, reference should be made to the following detailed description taken in conjunction with the accompanying drawings.

BRIEF DESCRIPTION OF THE DRAWINGS

In the drawings, which are not necessarily to scale.

DETAILED DESCRIPTION

The present invention is directed to a method and apparatus for processing radiation emitted by a substrate. Although the present invention may be used in any application requiring processing of such radiation, the present invention has particular application in a system for measuring substrate temperature.

Generally, processing of the substrate requires precise analysis of the radiation emitted by the substrate. For example, if the substrate is a semiconductor wafer (e.g., a silicon wafer), it may be characterized by a bandgap energy (direct or indirect) that decreases as the wafer temperature increases. As a general rule of thumb, radiant energy that is greater than the bandgap energy is absorbed by the substrate, while lower energy radiation is transmitted through the substrate. The intensity of radiation emitted by the substrate at given bandgap energies must therefore be precisely measured to accurately determine the temperature of the substrate 20.

Figure 1:
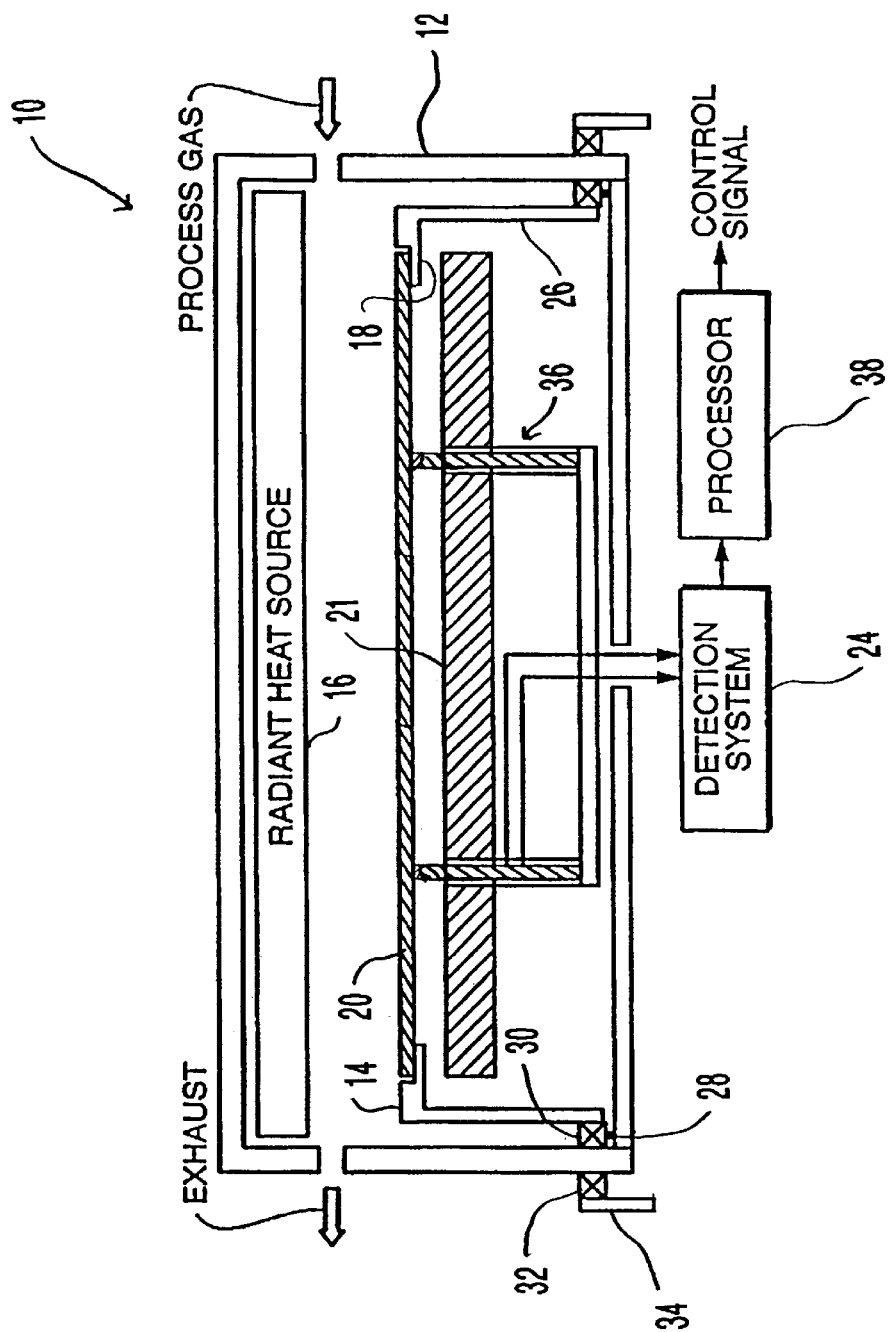
FIG. 1 is a side schematic view of an apparatus for thermally processing a wafer in accordance with one aspect of the present invention.

Preferably, the lift pin of the present invention is employed in a substrate processing system such as is shown in FIG. 1. As shown therein, a thermal processing apparatus 10 includes a chamber 12 that contains a substrate support 14 and a radiant heat source 16. The substrate support 14 includes a support ring 18 which contacts the peripheral edge of a substrate 20 (e.g., a semiconductor wafer characterized by a temperature-responsive bandgap energy). Typically, the support ring 18 contacts only a smaller fraction of the bottom surface of the substrate 20, leaving a larger fraction of the substrate surface exposed to emit radiation to a reflector 21. The underside of the substrate 20 and the top surface of the reflector 21 form a reflecting cavity that enhances the effective emissivity of the substrate 20. The support ring 18 is mounted on a support tube 26 that is rotatably supported by a bearing assembly 28. Magnets 30 mounted on the bearing assembly 28 magnetically couple with magnets 32 mounted on a drive ring 34. As the drive ring 34 rotates, the magnetic coupling causes the support tube 26 and support ring 18 to rotate. Alternatively, the bearing assembly 28 and magnets 30, 32 may be replaced by a sealed drive assembly, or other drive mechanism known in the art.

In operation, the radiant heat source 16 heats the interior of the chamber 12 to a desired preheat temperature (e.g., about 300–400 degrees Celsius). A robot arm then moves the substrate 20 into the chamber 12 through an opening in the wall of the chamber 12. A lift pin assembly 36 rises up from beneath the substrate 20, lifts the substrate 20 off of the robot arm (at which point the robot arm may be withdrawn from the chamber 12), and lowers the substrate 20 onto the support ring 18. To avoid problems (e.g., substrate warping or other substrate degradation) that might result from the rapid increase in temperature by contact between the substrate 20 and the preheated substrate support 14, the lift pin assembly 36 holds substrate 20 in a fixed position adjacent to the radiant heat source 16 until the temperature of the substrate 20 is within a desired range (e.g., 300–350 degrees Celsius). At this point, the substrate is lowered onto the support ring 18 and the substrate 20 is processed. One or more lift pin assemblies, rather than a single lift pin assembly, may be employed within the scope of the present invention. Further, the various components of the thermal processing system and method are merely exemplary, and other variations known in the art may be employed within the scope of the present invention.

Figure 2:
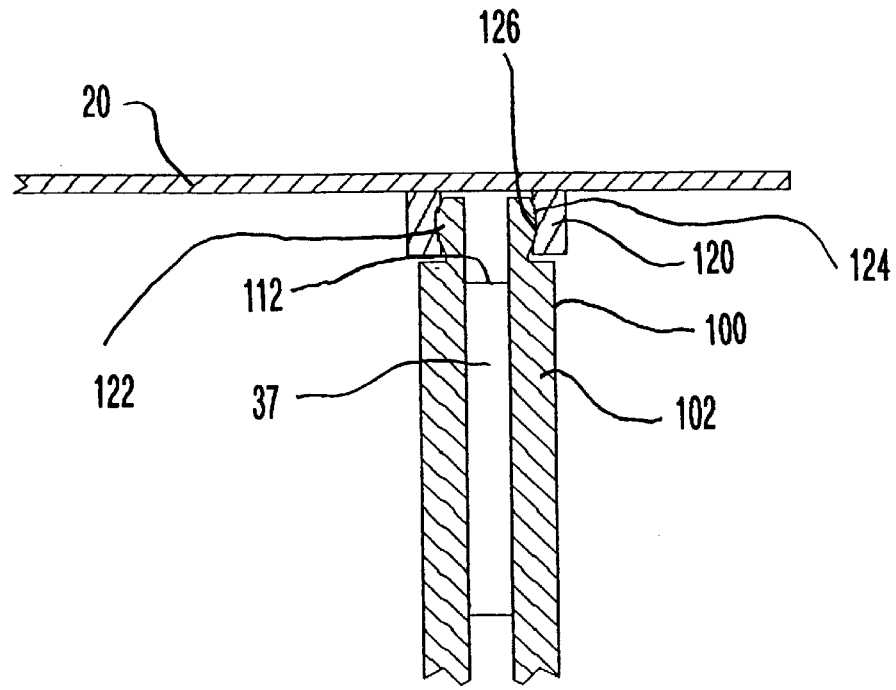
FIG. 2 is a side view of a lift pin in accordance with one aspect of the present invention.

Referring to FIG. 2, the lift pin assembly 36 includes a lift pin 100 that is formed of an outer sheath 102 and an inner optical transmission channel 37. The outer sheath may be formed from suitable materials known in the art, such as silicon having a thickness of about 2 mm. The optical transmission channel may be formed of a light pipe of suitable material, such as quartz or sapphire. The optical transmission channel 37 is coupled to a detector (not shown), through means known in the art. The ends of the optical transmission channel are preferably polished to improve transmission through the channel. The outer sheath 102 may extend beyond the end 112 of the optical transmission channel 37 closest to the substrate so that the optical transmission channel 37 does not contact the substrate. Suitable variation in the structure, materials, and other aspects of the lift pin will be apparent to those of skill in the art.

To evaluate the substrate temperature, a detection system 24 (shown in FIG. 1) receives radiation emitted by the substrate through the optical transmission channel 37 and provides signals to a processor 38. The processor is preferably configured to compute from the detection system signals a measure of the substrate temperature. Of course, the processor 38 may be configured to perform other functions, such as computation of other temperature information such as an indication of the relative accuracy of the computed measure of substrate temperature, and/or computation of a measure of the rate at which the substrate 20 is heated inside the chamber 12. The processor 38 preferably uses this information to provide a signal that controls subsequent processing, such as the timing of when the substrate is lowered onto the support ring. In this way, indirect pyrometric temperature measurements may be used to control the preheating stage of the substrate processing. The lift pin assembly of the present invention, however, is not limited to systems for determining the temperature of the substrate. Rather, the present invention may be employed in any system wherein precise analysis of radiation emitted from a substrate or other object is desired.

The detector and detection system may employ various means known in the art. For example, the detector may be a silicon photodiode and/or an indium gallium arsenide (InGaAs) photodetector. Multiple detectors may be employed, for example, to measure intensity at different bandgap energies. Further, the detection system may employ one or more filters. U.S. Pat. No. 6,151,446 describes examples of such detection systems.

The lift pin assembly 36 of the current invention is configured so that the radiation transmitted through the optical transmission channel 37 most accurately reflects the radiation emitted by the substrate 20. In the embodiment shown in FIG. 2, the lift pin assembly 36 comprises a contact member 120 that is flexibly mounted with respect to the outer sheath 102. This flexible connection between the contact member 120 and the outer sheath 102 allows the contact member 120 to seat more closely against the underside of the substrate 20. Preferably, the contact member 120 is connected to the distal end 122 of the outer sheath 102 such that the contact member 120 is rotatable about at least two axes with respect to the outer sheath. For instance, the contact member 120 may include a concave surface 124 which seats against a convex surface 126 of the distal end 122 of the outer sheath 102, allowing the contact member to rotate about the top of outer sheath, as in a ball and socket connection. Alternatively, the distal end 122 may have a concave surface and the contact member 120 a convex surface. Further, the contact member 120 may be connected to one or more other members (not shown), which are in turn connected to the outer sheath 102. Other configurations known in the art for providing a flexible connection may also be used within the scope of the present invention.

This flexible connection between the contact member 120 and the outer sheath 102 allows the detection system 24 to more accurately detect the radiation emitted by the substrate 20. If the underside of the substrate, or the portion of the surface of the substrate 20 adjacent to the lift pin, is oriented at an angle to the lift pin, there is the possibility that radiation emitted from the substrate will not be captured in the optical transmission channel. Similarly, there is the possibility that background radiation, which is not emitted by the substrate, will be captured in the optical transmission channel. These possibilities are minimized by the flexible connection, which allows the portion of the lift pin that is in contact with the substrate to adjust to the orientation of the substrate, reducing the risk of a gap between the contact member and the substrate through which radiation can enter or escape.

Figure 3:
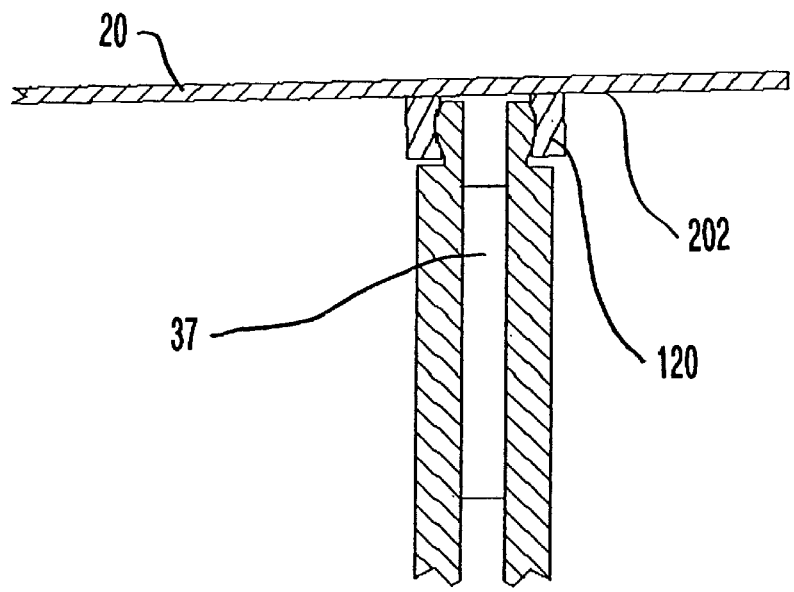
FIG. 3 is a side view of the lift pin shown in FIG. 2 when seated against an uneven substrate surface, in accordance with one aspect of the present invention.

The advantage of this flexibility can be seen by comparing FIGS. 2 and 3. In FIG. 2, the underside of the substrate 20 is relatively flat and level with respect to the contact member 120. In FIG. 3, the underside 202 of the substrate 20 is at an angle. If the contact portion of the lift pin were not flexible, there would be a gap between part of the lift pin and the substrate. Through that gap, radiation could enter or escape the optical transmission channel 37, reducing the accuracy of the temperature measurement. With the lift pin of the present invention, the contact member 120 adjusts to the angle of the substrate, reducing or eliminating the possibility of a gap between the lift pin and the substrate. Accuracy of the measurement by the detector of the intensity of the emitted radiation is thereby enhanced.

Those skilled in the art to which the invention pertains may make modifications and other embodiments employing the principles of this invention without departing from its spirit or essential characteristics particularly upon considering the foregoing teachings. The described embodiments are to be considered in all respects only as illustrative and not restrictive and the scope of the invention is, therefore, indicated by the appended claims rather than by the foregoing description Consequently, while the invention has been described with reference to particular embodiments, modifications of structure, sequence, materials and the like would be apparent to those skilled in the art, yet still fall within the scope of the invention.

What is claimed is:

1. An apparatus for use in thermally processing a substrate inside a processing chamber having a radiation source for heating the substrate, comprising:

a lift pin for contacting the substrate, said lift pin configured to convey radiation from the substrate to a detector;

said lift pin comprising a contact member for contacting the substrate, said contact member adjustable to seat against the substrate;

said detector configured to receive radiation from the substrate and to produce a signal representative of the intensity of the received radiation; and a processor configured to compute temperature information regarding the substrate based on said signal.

2. The apparatus of claim 1, wherein said lift pin further comprises a pin member pivotally connected to said contact member, said pin member configured to convey radiation from said substrate to said detector.

3. The apparatus of claim 2, wherein said pin member comprises a hollow structure.

4. The apparatus of claim 3, wherein said hollow structure comprises a first end positioned adjacent to said contact member, and a second end connected to said detector.

5. An apparatus for thermally processing a substrate inside a processing chamber having a radiation source for heating the substrate, comprising:

connection means for conveying radiation from a substrate, said connection means comprising adjustable contact means for contacting said substrate;

detector means for receiving radiation from the substrate;

signal means for producing a signal representative of the intensity of the received radiation; and processor means for computing temperature information regarding the substrate based on said signal.

6. An apparatus for conveying radiation from a substrate, comprising:

a contact member that can be seated against the substrate;

a pin member having a first end connected to said contact member such that said contact member is rotatable about at least two axes with respect to said first end;

said pin member further comprising a hollow portion for conveying radiation from the substrate.

7. The apparatus of claim 6 wherein said contact member is pivotally connected to said first end of said pin member.

8. The apparatus of claim 6, wherein said contact member is connected to said first end of said pin member by a ball and socket connection.

9. In a device for thermally processing a substrate, an apparatus comprising:

a pin member connected to a processor;

a contact member pivotally positioned on said pin member;

said contact member positioned to support a substrate during thermal processing of the substrate.

10. The apparatus of claim 9, wherein said contact member comprises a contact surface positioned to seat against said substrate.

11. The apparatus of claim 9, further comprising a detector configured to receive radiation conveyed through said pin member.

12. The apparatus of claim 9 further comprising a processor configured to calculate temperature information based at least in part on radiation conveyed through said pin member.

13. A method of thermally processing a substrate inside a processing chamber, comprising:

radiatively heating a substrate;

conveying radiation from the substrate to a detector, wherein said radiation passes through a contact member in contact with the substrate and a conveyance member positioned between said contact member and said detector; and adjusting the position of the contact member to maintain contact between the contact member and the substrate.

14. The method of claim 13, wherein said step of conveying radiation from the substrate further comprises adjusting the contact member with respect to the conveyance member in at least two degrees of freedom.

15. The method of claim 13, wherein said step of conveying radiation from the substrate further comprises adjusting the contact member through a ball and socket connection.

16. The method of claim 13, further comprising the steps of:

generating an intensity signal representative of the radiation received from the substrate;

computing an indication of the rate at which the substrate is being heated; and controlling the timing for placing the substrate on a platform inside the processing chamber based on the computed heating rate.

17. A method of thermally processing a substrate, comprising:

supporting a substrate on a contact member;

conveying radiation from the substrate through the contact member and through a conveyance member to a detector, wherein said contact member is connected to said conveyance member such that said contact member is rotatable with respect to said conveyance member about at least two axes; and processing said radiation.

18. The method of claim 17, further comprising the steps of:

generating an intensity signal relating to the radiation received from the substrate;

generating a control signal based on said intensity signal for controlling the timing of subsequent processing of the substrate.

19. In a device for processing a substrate inside a processing chamber, apparatus comprising:

means for heating a substrate;

contact means for contacting the substrate;

means for adjusting the position of said contact means to match the portion of the substrate adjacent to said contact means; and conveyance means for conveying radiation from the substrate to a detector.

* * * * *